United States Patent
Nielsen et al.

(12)

(10) Patent No.: US 11,898,428 B2
(45) Date of Patent: Feb. 13, 2024

(54) SIGNAL GENERATORS FOR ELECTROMAGNETIC HEATING AND SYSTEMS AND METHODS OF PROVIDING THEREOF

(71) Applicant: Acceleware Ltd., Calgary (CA)

(72) Inventors: Jorgen S. Nielsen, Calgary (CA); Michal M. Okoniewski, Calgary (CA)

(73) Assignee: Acceleware Ltd., Calgary (CA)

( * ) Notice: Subject to any disclaimer, the term of this patent is extended or adjusted under 35 U.S.C. 154(b) by 240 days.

(21) Appl. No.: 17/441,776

(22) PCT Filed: Mar. 16, 2020

(86) PCT No.: PCT/CA2020/050348
§ 371 (c)(1),
(2) Date: Sep. 22, 2021

(87) PCT Pub. No.: WO2020/191481
PCT Pub. Date: Oct. 1, 2020

(65) Prior Publication Data
US 2022/0178233 A1 Jun. 9, 2022

Related U.S. Application Data

(60) Provisional application No. 62/823,299, filed on Mar. 25, 2019.

(51) Int. Cl.
*H03K 5/00* (2006.01)
*E21B 43/24* (2006.01)
(Continued)

(52) U.S. Cl.
CPC .......... *E21B 43/2401* (2013.01); *E21B 36/04* (2013.01); *E21B 47/07* (2020.05);
(Continued)

(58) Field of Classification Search
CPC .................................................. H03K 5/00006
See application file for complete search history.

(56) References Cited

U.S. PATENT DOCUMENTS

| 2,757,738 A | 8/1956 | Ritchey |
| 3,169,577 A | 2/1965 | Sarapuu |

(Continued)

FOREIGN PATENT DOCUMENTS

| CA | 2816101 A1 | 5/2012 |
| CA | 2816297 A1 | 5/2012 |

(Continued)

OTHER PUBLICATIONS

International Search Report and Written Opinion dated Jun. 5, 2020 in International Patent Application No. PCT/CA2020/050348 (11 pages).

(Continued)

*Primary Examiner* — Sibin Chen
(74) *Attorney, Agent, or Firm* — BERESKIN & PARR LLP/S.E.N.C.R.L. s.r.l; Isis E. Caulder; Maria Wei

(57) ABSTRACT

A signal generator, system, and method for electromagnetically heating of a hydrocarbon formation. The method involves determining a desired output signal having a desired power spectral density; generating a plurality of source signals, based on the desired output signal; modulating the plurality of source signals, based on the desired output signal, to provide a plurality of modulated signals capable of providing the desired power spectral density; combining one or more of the plurality of modulated signals into a combined signal; transforming the combined signal to have the desired power spectral density, thereby providing at least one output signal; and applying the at least one output signal to a load having a frequency-dependent impedance to produce at least one standing electromagnetic wave along a length of the load. The at least one standing electromagnetic (Continued)

wave includes at least a partial standing electromagnetic wave.

21 Claims, 6 Drawing Sheets

(51) Int. Cl.
*E21B 47/13* (2012.01)
*E21B 47/07* (2012.01)
*E21B 36/04* (2006.01)
*H05B 6/06* (2006.01)

(52) U.S. Cl.
CPC .......... *E21B 47/13* (2020.05); *H03K 5/00006* (2013.01); *H05B 6/06* (2013.01); *H05B 2214/03* (2013.01)

(56) References Cited

U.S. PATENT DOCUMENTS

| | | |
|---|---|---|
| 3,170,519 A | 2/1965 | Haagensen |
| 3,522,848 A | 8/1970 | New |
| 4,135,579 A | 1/1979 | Rowland et al. |
| 4,140,179 A | 2/1979 | Kasevich et al. |
| 4,140,180 A | 2/1979 | Bridges et al. |
| 4,144,935 A | 3/1979 | Bridges et al. |
| 4,193,451 A | 3/1980 | Dauphine |
| 4,301,865 A | 11/1981 | Kasevich et al. |
| 4,319,632 A | 3/1982 | Marr, Jr. |
| 4,320,801 A | 3/1982 | Rowland et al. |
| 4,449,585 A | 5/1984 | Bridges et al. |
| 4,470,459 A | 9/1984 | Copland |
| 4,487,257 A | 12/1984 | Dauphiné |
| 4,508,168 A | 4/1985 | Heeren |
| 4,513,815 A | 4/1985 | Rundell et al. |
| 4,583,589 A | 4/1986 | Kasevich |
| 4,620,593 A | 11/1986 | Haagensen |
| 5,099,918 A | 3/1992 | Bridges et al. |
| 5,293,936 A | 3/1994 | Bridges |
| 6,189,611 B1 | 2/2001 | Kasevich |
| 6,208,529 B1 | 3/2001 | Davidson |
| 6,285,014 B1 | 9/2001 | Beck et al. |
| 6,521,874 B2 | 2/2003 | Thompson et al. |
| 7,075,392 B2 | 7/2006 | Smith et al. |
| 7,091,460 B2 | 8/2006 | Kinzer |
| 7,312,428 B2 | 12/2007 | Kinzer |
| 7,359,223 B2 | 4/2008 | Datta et al. |
| 7,484,561 B2 | 2/2009 | Bridges |
| 7,626,836 B2 | 12/2009 | Leggate et al. |
| 7,817,101 B2 | 10/2010 | Cowles |
| 7,891,421 B2 | 2/2011 | Kasevich |
| 8,453,739 B2 | 6/2013 | Parsche |
| 8,511,378 B2 | 8/2013 | Parsche et al. |
| 8,537,912 B2 * | 9/2013 | Long .................... H04L 5/0007 375/267 |
| 8,648,760 B2 | 2/2014 | Parsche |
| 8,763,691 B2 | 7/2014 | Parsche |
| 8,789,599 B2 | 7/2014 | Parsche |
| 9,664,021 B2 | 5/2017 | Hyde et al. |
| 10,760,392 B2 | 9/2020 | Okoniewski et al. |
| 10,774,629 B2 | 9/2020 | Okoniewski et al. |
| 11,359,473 B2 | 6/2022 | Okoniewski et al. |
| 2001/0011590 A1 | 8/2001 | Thomas et al. |
| 2004/0084442 A1 | 5/2004 | La Rovere |
| 2006/0102625 A1 | 5/2006 | Kinzer |
| 2006/0146944 A1 * | 7/2006 | Chiu .................... H04L 5/0044 375/260 |
| 2007/0215613 A1 | 9/2007 | Kinzer |
| 2007/0252568 A1 | 11/2007 | Chien |
| 2009/0173488 A1 | 7/2009 | Varma |
| 2011/0006055 A1 | 1/2011 | Diehl |
| 2011/0042063 A1 | 2/2011 | Diehl et al. |
| 2011/0094755 A1 | 4/2011 | Corbett et al. |
| 2011/0146981 A1 | 6/2011 | Diehl |
| 2011/0253367 A1 | 10/2011 | Banerjee et al. |
| 2011/0303423 A1 | 12/2011 | Kaminsky et al. |
| 2012/0018140 A1 | 1/2012 | Parsche |
| 2012/0067580 A1 | 3/2012 | Parsche |
| 2012/0073798 A1 | 3/2012 | Parsche et al. |
| 2012/0118565 A1 | 5/2012 | Trautman et al. |
| 2012/0125609 A1 | 5/2012 | Parsche |
| 2013/0192825 A1 | 8/2013 | Parsche |
| 2014/0131032 A1 | 5/2014 | Dittmer |
| 2014/0262225 A1 | 9/2014 | Campbell et al. |
| 2014/0290934 A1 | 10/2014 | Parsche |
| 2015/0013967 A1 | 1/2015 | Parsche |
| 2015/0381401 A1 * | 12/2015 | Butterfield .............. H03F 1/02 375/295 |
| 2016/0047213 A1 | 2/2016 | Grounds, III et al. |
| 2016/0097268 A1 | 4/2016 | Okoniewski et al. |
| 2019/0138809 A1 * | 5/2019 | Doshi .................. G06F 16/7844 |

FOREIGN PATENT DOCUMENTS

| | | |
|---|---|---|
| CA | 2816297 C | 5/2017 |
| CN | 101206266 A | 6/2008 |
| EP | 1779938 A2 | 5/2007 |
| WO | 2005/091883 A2 | 10/2005 |
| WO | 2008/115359 A1 | 9/2008 |
| WO | 2012/067769 A2 | 5/2012 |
| WO | 2017/177319 A1 | 10/2017 |

OTHER PUBLICATIONS

"available power", International Electrotechnical Commission, 1992 <http://www.electropedia.org/iev/iev.nsf/display?openform&ievref=702-07-10>. (2 pages).

Wacker, et al., "Electromagnetic Heating for In-Situ Production of Heavy Oil and Bitumen Reservoirs", Society of Petroleum Engineers, 2011, pp. 1-14, Calgary, Canada.

* cited by examiner

SIGNAL GENERATORS FOR ELECTROMAGNETIC HEATING AND SYSTEMS AND METHODS OF PROVIDING THEREOF

CROSS-REFERENCE TO RELATED APPLICATION

This application is a 35 USC § 371 national stage entry of International Patent Application No. PCT/CA2020/050348, filed Mar. 16, 2020, which claims priority from U.S. Provisional Patent Application Ser. No. 62/823,299, filed Mar. 25, 2019; the entire contents of each of which are hereby incorporated by reference.

FIELD

The embodiments described herein relate to signal generators for electromagnetic heating, and in particular to signal generators and associated systems and methods for generating output signals for loads having frequency-dependent impedances.

BACKGROUND

Signal generators can be used to generate a variety of electrical signals. Certain electrical signals generated by a signal generator can be applied to a load to produce electromagnetic (EM) energy. Various properties of the electrical signals and the load may affect the EM energy produced by the load. For example, the load may have a frequency-dependent impedance which attenuates the EM energy based on the frequency of the electrical signals.

EM energy can be used to heat hydrocarbons. Similar to traditional steam-based technologies, the application of EM energy to heat hydrocarbons can reduce viscosity and mobilize bitumen and heavy oil for production or transportation.

EM heating of hydrocarbon formations can be achieved by using a load, such as an EM radiator, antenna, applicator, or lossy transmission line, positioned inside an underground reservoir to radiate, or couple, EM energy to the hydrocarbon formation. Hydrocarbon formations can include heavy oil formations, oil sands, tar sands, carbonate formations, shale oil formations, and any other hydrocarbon bearing formations, or any other mineral. It may be desirable to control the EM energy produced by a load in order to more efficiently produce or transport hydrocarbons.

SUMMARY

The various embodiments described herein generally relate to signal generators and associated systems and methods for generating output signals. The signal generator can include a plurality of voltage sources, a plurality of switch groups, at least one switch network driver, a signal combining unit, and a processor. The plurality of voltage sources generate a plurality of source signals. The plurality of switch groups convert the plurality of source signals into a plurality of modulated signals by actuating one or more switches of the plurality of switch groups. The plurality of modulated signals are capable of providing a desired power spectral density. The at least one switch network driver provides a plurality of modulation signals to the plurality of switch groups. The one or more switches of the switch groups are actuated by the plurality of modulation signals. The signal combining unit includes at least one transformer. The signal combining unit combines one or more of the plurality of modulated signals into a combined signal and transforms the combined signal to have the desired power spectral density, thereby providing at least one output signal. The processor is configured to determine a desired output signal having the desired power spectral density and control the plurality of voltage sources, the at least one switch network driver, and the signal combining unit based on the desired output signal. When the at least one output signal is applied to a load having a frequency-dependent impedance, at least one standing electromagnetic wave is produced along a length of the load. The at least one standing electromagnetic wave includes at least a partial standing electromagnetic wave.

In any embodiment, the frequency-dependent impedance may vary with respect to at least one of a mechanical configuration of the load and a temporal quasi-static electromagnetic property of the load.

In any embodiment, the load may include at least one radiating structure positioned in a hydrocarbon formation. When the at least one output signal is applied to a load, electromagnetic energy can be radiated into the hydrocarbon formation, and the at least one standing electromagnetic wave can be produced along a length of the at least one radiating structure.

In any embodiment, the at least one standing electromagnetic wave may correspond to a desired spatial heating profile to be achieved along the length of the at least one radiating structure.

In any embodiment, the at least one radiating structure may include a first transmission line conductor and a second transmission line conductor. The at least one output signal may include a first output signal for being applied to the first transmission line conductor and a second output signal for being applied to the second transmission line conductor. The second output signal may be a phase shifted version of the first output signal.

In any embodiment, the plurality of modulation signals may include at least one time-varying modulation signal.

In any embodiment, the plurality of modulation signals may include a binary waveform.

In any embodiment, the at least one standing electromagnetic wave may be time-varying.

In any embodiment, the one or more switches of the switch groups may be actuated by the plurality of modulation signals at different times to generate the modulated signals.

In any embodiment, each modulation signal may include a dwell time for the one or more switch being actuated by the modulation signal.

In any embodiment, the dwell time may be based on whether the one or more switch is in either an open position or a closed position.

In any embodiment, the one of more switches of the plurality of switch groups may include at least two switches.

In any embodiment, each of the plurality of switch groups may be connected to an input of the signal combining unit to provide the plurality of modulated signals to the signal combining unit.

In any embodiment, the plurality of switch groups may have a switching frequency within the range of about 1 kilohertz (kHz) to about 100 megahertz (MHz).

In any embodiment, the plurality of switch groups may include at least one of a half H-bridge, an H-bridge, a buck converter, a buck-boost converter, a resonant converter, a soft switching converter, and a zero voltage switching converter.

In any embodiment, each switch of the plurality of switch groups may have a high current capacity.

In any embodiment, each switch of the plurality of switch groups may have a high voltage capability.

In any embodiment, each switch of the plurality of switch groups may include a solid-state switch.

In any embodiment, the plurality of source signals may include at least one of a direct current signal and a low frequency signal having a frequency that is at least ten times lower than frequencies of the at least one output signal.

In any embodiment, the processor being configured to control the plurality of voltage sources may include the processor being configured to control a voltage level of at least one of the plurality of source signals.

In any embodiment, the processor being configured to control the signal combining unit may include the processor being configured to select a configuration of the at least one transformer to achieve the desired power spectral density.

In any embodiment, the signal generator may further include at least one signal generator sensing device for measuring one or more properties of at least one of the plurality of voltage sources, the plurality of switch groups, and the signal combining unit. The one or more properties may include at least one of temperature, current, and voltage. The processor being configured to determine the desired output signal having the desired power spectral density may be further based on a comparison of the one or more properties measured from the at least one of the plurality of voltage sources, the plurality of switch groups, and the signal combining unit, with at least one of an arcing condition, an overheating condition, an overcurrent condition, and an excessive voltage condition.

In any embodiment, the signal generator may further include at least one load sensing device for measuring one or more properties of the load. The one or more properties may include at least one of temperature, pressure, production level, material properties, impedance, reactance, resistance, power, and frequency. The processor being configured to determine the desired output signal having the desired power spectral density may be further based on the one or more properties measured from the load.

In any embodiment, the signal combining unit may further include a plurality of inductive and capacitive components. The processor being configured to control the signal combining unit may further include the processor being configured to operate the plurality of inductive and capacitive components.

In any embodiment, the processor being configured to control the at least one switch network driver and operate the plurality of inductive and capacitive components may be further based on adjusting for a reactance measured in the load.

In any embodiment, the at least one output signal may have a bandwidth between about 1 kilohertz (kHz) to about 100 megahertz (MHz).

In a aspect, a method may involve determining a desired output signal having a desired power spectral density; generating a plurality of source signals, based on the desired output signal; modulating the plurality of source signals, based on the desired output signal, to provide a plurality of modulated signals capable of providing the desired power spectral density; combining one or more of the plurality of modulated signals into a combined signal; transforming the combined signal to have the desired power spectral density, thereby providing at least one output signal; and applying the at least one output signal to a load having a frequency-dependent impedance to produce at least one standing electromagnetic wave along a length of the load. The at least one standing electromagnetic wave can include at least a partial standing electromagnetic wave.

In any embodiment, the frequency-dependent impedance may vary with respect to at least one of a mechanical configuration of the load and a temporal quasi-static electromagnetic property of the load.

In any embodiment, the load may include at least one radiating structure positioned in a hydrocarbon formation. Applying the at least one output signal to the load can radiate electromagnetic energy into the hydrocarbon formation. The at least one standing electromagnetic wave may be produced along a length of the at least one radiating structure.

In any embodiment, the at least one standing electromagnetic wave may correspond to a desired spatial heating profile to be achieved along the length of the at least one radiating structure.

In any embodiment, the at least one output signal may include a first output signal and a second output signal. The second output signal may be a phase shifted version of the first output signal. The at least one radiating structure may include a first transmission line conductor and a second transmission line conductor. Applying the at least one output signal to at least one radiating structure may include applying the first output signal to the first transmission line conductor and applying the second output signal to the second transmission line conductor.

In any embodiment, modulating the plurality of source signals may involve actuating the one or more switches with a first frequency in a first time frame and subsequently actuating the one or more switches with a second frequency in a second time frame. The second frequency may be different from the first frequency.

In any embodiment, modulating the plurality of source signals may involve actuating one or more switches.

In any embodiment, the at least one standing electromagnetic wave may be time-varying.

In any embodiment, modulating the plurality of source signals may involve actuating one or more switches at different times to generate the modulated signals.

In any embodiment, actuating one or more switches may involve delaying the actuation of the one or more switch until a dwell time for the one or more switch has elapsed.

In any embodiment, the dwell time for the one or more switch may be based on whether the one or more switch is in either an open position or a closed position.

In any embodiment, the plurality of source signals may include at least one of a direct current signal and a low frequency signal having a frequency that is at least ten times lower than frequencies of the at least one output signal.

In any embodiment, generating a plurality of source signals may further involve controlling a voltage level of at least one of the plurality of source signals.

In any embodiment, transforming the combined signal to have the desired power spectral density may further involve selecting a configuration of at least one transformer to achieve the desired power spectral density.

In any embodiment, determining a desired output signal having a desired power spectral density may involve measuring one or more properties of at least one of a plurality of voltage sources used for generating a plurality of source signals, a plurality of switch groups used for modulating the plurality of source signals to provide a plurality of modulated signals, and a signal combining unit used for combining one or more of the plurality of modulated signals into a combined signal and providing the at least one output signal; and determining the desired output signal having the desired power spectral density based on a comparison of the one or more properties measured from the at least one of the plurality of voltage sources, the plurality of switch groups, and the signal combining unit with at least one of an arcing condition, an overheating condition, an overcurrent condition, and an excessive voltage condition. The one or more properties may include at least one of temperature, current, and voltage.

In any embodiment, determining a desired output signal having a desired power spectral density may involve measuring one or more properties of the load; and determining the desired output signal having the desired power spectral density based on the one or more properties measured from the load. The one or more properties may include at least one of temperature, pressure, production level, material properties, impedance, reactance, resistance, power, and frequency.

In any embodiment, the method may further involve operating at least one of a plurality of inductive and capacitive components to adjust for a reactance in at least one of the plurality of voltage sources, the plurality of switch groups, and the signal combining unit.

In any embodiment, at least one of modulating the plurality of source signals and operating at least one of a plurality of inductive and capacitive components may be based on adjusting for a reactance measured in the load.

In any embodiment, the at least one output signal may have a bandwidth between about 1 kilohertz (kHz) to about 100 megahertz (MHz).

In a broad aspect, a system may include an electrical power source, a signal generator, at least one waveguide, and the at least one radiating structure. The signal generator can generate an output signal having a desired power spectral density. The signal generator can be powered by the electrical power source. The waveguide can carry the at least one output signal to at least one radiating structure. The at least one radiating structure can be positioned in the hydrocarbon formation and excitable by the at least one output signal to radiate electromagnetic energy into the hydrocarbon formation and produce at least one standing electromagnetic wave along a length of the at least one radiating structure. The at least one standing electromagnetic wave can correspond to a desired spatial heating profile to be achieved along the length of the at least one radiating structure. The standing electromagnetic wave can include at least a partial standing electromagnetic wave.

In any embodiment, the at least one radiating structure may include at least one pair of transmission line conductors. Each pair of transmission line conductors may include a first transmission line conductor and a second transmission line conductor.

Further aspects and advantages of the embodiments described herein will appear from the following description taken together with the accompanying drawings.

BRIEF DESCRIPTION OF THE DRAWINGS

For a better understanding of the embodiments described herein and to show more clearly how they may be carried into effect, reference will now be made, by way of example only, to the accompanying drawings which show at least one exemplary embodiment, and in which.

Figure 1:
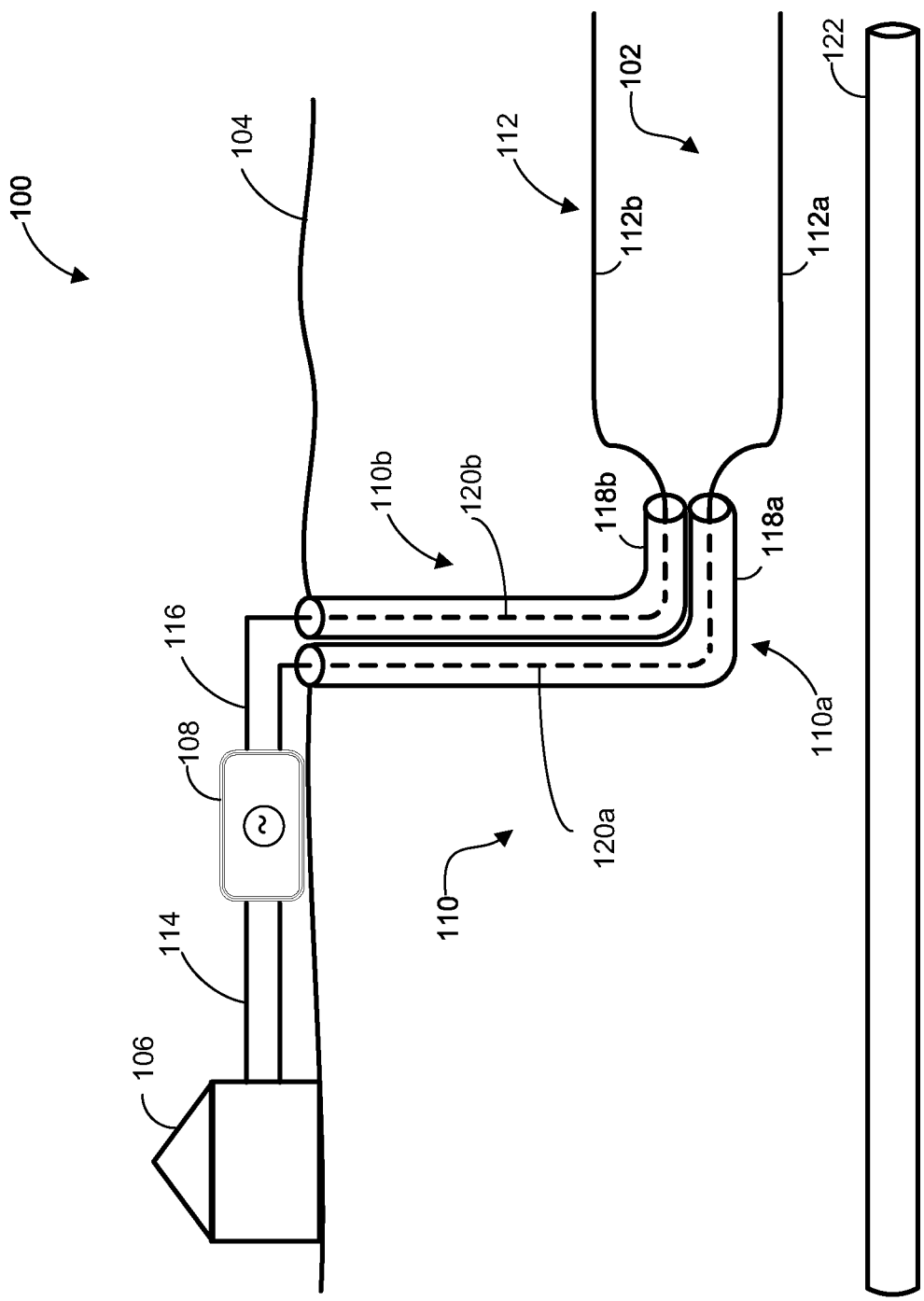
FIG. 1 is profile view of an apparatus for electromagnetic heating of a hydrocarbon formation, in accordance with at least one embodiment.

The skilled person in the art will understand that the drawings, described below, are for illustration purposes only. The drawings are not intended to limit the scope of the applicants' teachings in any way. Also, it will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DESCRIPTION OF VARIOUS EMBODIMENTS

It will be appreciated that numerous specific details are set forth in order to provide a thorough understanding of the exemplary embodiments described herein. However, it will be understood by those of ordinary skill in the art that the embodiments described herein may be practiced without these specific details. In other instances, well-known methods, procedures and components have not been described in detail so as not to obscure the embodiments described herein. Furthermore, this description is not to be considered as limiting the scope of the embodiments described herein in any way, but rather as merely describing the implementation of the various embodiments described herein.

It should be noted that terms of degree such as "substantially", "about" and "approximately" when used herein mean a reasonable amount of deviation of the modified term such that the end result is not significantly changed. These terms of degree should be construed as including a deviation of the modified term if this deviation would not negate the meaning of the term it modifies.

In addition, as used herein, the wording "and/or" is intended to represent an inclusive-or. That is, "X and/or Y" is intended to mean X or Y or both, for example. As a further example, "X, Y, and/or Z" is intended to mean X or Y or Z or any combination thereof.

It should be noted that the term "coupled" used herein indicates that two elements can be directly coupled to one another or coupled to one another through one or more intermediate elements.

It should be noted that phase shifts or phase differences between time-harmonic (e.g. a single frequency sinusoidal) signals can also be expressed as a time delay. For time harmonic signals, time delay and phase difference convey the same physical effect. For example, a 180° phase difference between two time-harmonic signals of the same frequency can also be referred to as a half-period delay. As a further example, a 90° phase difference can also be referred to as a quarter-period delay. Time delay is typically a more general concept for comparing periodic signals. For instance, if the periodic signals contain multiple frequencies (e.g. a series of rectangular or triangular pulses), then the time lag between two such signals having the same fundamental harmonic is referred to as a time delay. For simplicity, in the case of single frequency sinusoidal signals the term "phase shift" shall be used. In the case of multi-frequency periodic signals, the term "phase shift" shall refer to the time delay equal to the corresponding time delay of the fundamental harmonic of the two signals.

The term radio frequency when used herein is intended to extend beyond the conventional meaning of radio frequency. The term radio frequency is considered here to include frequencies at which physical dimensions of system components are comparable to the wavelength of the EM wave. System components that are less than approximately 10 wavelengths in length can be considered comparable to the wavelength. For example, a 1 kilometer (km) long underground system that uses EM energy to heat underground formations and operates at 50 kilohertz (kHz) will have physical dimensions that are comparable to the wavelength. If the underground formation has significant water content, (e.g., relative electrical permittivity being approximately 60 and conductivity being approximately 0.002 S/m), the EM wavelength at 50 kHz is 303 meters. The length of the 1 km long radiator is approximately 3.3 wavelengths. If the underground formation is dry (e.g., relative electrical permittivity being approximately 6 and conductivity being approximately 3E-7 S/m), the EM wavelength at 50 kHz is 2450 meters. The length of the radiator is then approximately 0.4 wavelengths. Therefore in both wet and dry scenarios, the length of the radiator is comparable to the wavelength. Accordingly, effects typically seen in conventional RF systems will be present and while 50 kHz is not typically considered RF frequency, this system is considered to be an RF system.

Referring to FIG. 1, shown therein is a profile view of an apparatus 100 for electromagnetic heating of hydrocarbon formations according to at least one embodiment. The apparatus 100 can be used for electromagnetic heating of a hydrocarbon formation 102. The apparatus 100 includes an electrical power source 106, an electromagnetic (EM) wave generator 108, a waveguide portion 110, and transmission line conductor portion 112. FIG. 1 is provided for illustration purposes only and other configurations are possible.

As shown in FIG. 1, the electrical power source 106 and the electromagnetic wave generator 108 can be located at the surface 104. In at least one embodiment, any one or both of the electrical power source 106 and the electromagnetic wave generator 108 can be located below ground.

The electrical power source 106 generates electrical power. The electrical power source 106 can be any appropriate source of electrical power, such as a stand-alone electric generator or an electrical grid. The electrical power may be one of alternating current (AC) or direct current (DC). Power cables 114 carry the electrical power from the electrical power source 106 to the EM wave generator 108.

The EM wave generator 108 generates EM power. It will be understood that EM power can be high frequency alternating current, alternating voltage, current waves, or voltage waves. The EM power can be a periodic high frequency signal having a fundamental frequency (f0). The high frequency signal can have a sinusoidal waveform, square waveform, or any other appropriate shape. The high frequency signal can further include harmonics of the fundamental frequency. For example, the high frequency signal can include second harmonic $2f_0$, and third harmonic $3f_0$ of the fundamental frequency $f_0$. In some embodiments, the EM wave generator 108 can produce more than one frequency at a time. In some embodiments, the frequency and shape of the high frequency signal may change over time. The term "high frequency alternating current", as used herein, broadly refers to a periodic, high frequency EM power signal, which in some embodiments, can be a voltage signal.

As noted above, in some embodiments, the EM wave generator 108 can be located underground. An apparatus with the EM wave generator 108 located above ground rather than underground can be easier to deploy. However, when the EM wave generator 108 is located underground, transmission losses are reduced because EM energy is not dissipated in the areas that do not produce hydrocarbons (i.e., distance between the EM wave generator 108 and the transmission line conductor portion 112).

The waveguide portion 110 can carry high frequency alternating current from the EM wave generator 108 to the transmission line conductors 112a and 112b. Each of the transmission line conductors 112a and 112b can be coupled to the EM wave generator 108 via individual waveguides 110a and 110b. As shown in FIG. 1, the waveguides 110a and 110b can be collectively referred to as the waveguide portion 110. Each of the waveguides 110a and 110b can have a proximal end and a distal end. The proximal ends of the waveguides can be connected to the EM wave generator 108. The distal ends of the waveguides 110a and 110b can be connected to the transmission line conductors 112a and 112b.

Each waveguide 110a and 110b can be provided by a coaxial transmission line having an outer conductor 118a and 118b and an inner conductor 120a and 120b, respectively. In some embodiments, each of the waveguides 110a and 110b can be provided by a metal casing pipe as the outer conductor and the metal casings concentrically surrounding pipes, cables, wires, or conductor rods, as the inner conductors. In some embodiments, the outer conductors 118a and 118b can be positioned within at least one additional casing pipe along at least part of the length of the waveguide portion 110.

The transmission line conductor portion 112 can be coupled to the EM wave generator 108 via the waveguide portion 110. As shown in FIG. 1, the transmission line conductors 112a and 112b may be collectively referred to as the transmission line conductor portion 112. According to some embodiments, additional transmission line conductors 112 may be included.

Each of the transmission line conductors 112a and 112b can be defined by a pipe. In some embodiments, the apparatus may include more than two transmission line conductors. In some embodiments, only one or none of the transmission line conductors may be defined by a pipe. In some embodiments, the transmission line conductors 112a and 112b may be conductor rods, coiled tubing, or coaxial cables, or any other pipe to transmit EM energy from EM wave generator 108.

The transmission line conductors 112a and 112b have a proximal end and a distal end. The proximal end of the transmission line conductors 112a and 112b can be coupled to the EM wave generator 108, via the waveguide portion 110. The transmission line conductors 112a and 112b can be excited by the high frequency alternating current generated by the EM wave generator 108. When excited, the transmission line conductors 112a and 112b can form an open transmission line between transmission line conductors 112a and 112b. The open transmission line can carry EM energy in a cross-section of a radius comparable to a wavelength of the excitation. The open transmission line can propagate an EM wave from the proximal end of the transmission line conductors 112a and 112b to the distal end of the transmission line conductors 112a and 112b. In at least one embodiment, the EM wave may propagate as a standing wave. In at least one other embodiment, the electromagnetic wave may propagate as a partially standing wave. In yet at least one other embodiment, the electromagnetic wave may propagate as a travelling wave.

The hydrocarbon formation 102 between the transmission line conductors 112a and 112b can act as a dielectric medium for the open transmission line. The open transmission line can carry and dissipate energy within the dielectric medium, that is, the hydrocarbon formation 102. The open transmission line formed by transmission line conductors and carrying EM energy within the hydrocarbon formation 102 can be considered a "dynamic transmission line". By propagating an EM wave from the proximal end of the transmission line conductors 112a and 112b to the distal end of the transmission line conductors 112a and 112b, the dynamic transmission line can carry EM energy within long well bores. Well bores spanning a length of 500 meters (m) to 1500 meters (m) can be considered long.

Producer well 122 is located at or near the bottom of the underground reservoir to receive heated oil released from the hydrocarbon formation 102 by the EM heating process. The heated oil drains mainly by gravity to the producer well 122. As shown in FIG. 1, producer well 122 is substantially horizontal (i.e., parallel to the surface). Producer well 122, or a vertical projection of the producer well 122, can define a longitudinal axis along which the transmission line conductors 112a and 112b extend. Typically, the producer well 122 is located at the same depth or at a greater depth than at least one of the transmission line conductors 112a, 112b of the open transmission line 112. In some embodiments, the producer well 122 can be located above the transmission line conductors 112a, 112b of the open transmission line 112. The producer well 122 is typically positioned in between the transmission line conductors 112a, 112b, including being centered between the transmission line conductors 112a, 112b or with any appropriate offset from a center of the transmission line conductors 112a, 112b. In some applications, it can be advantageous to position the producer well 122 closer to a first transmission line conductors than a second transmission line conductor so that the region closer to the first transmission line conductor is heated faster, contributing to early onset of oil production.

As the hydrocarbon formation 102 is heated, steam is also released and displaces the heated oil that has drained to and is collected in the producer well 122. The steam can accumulate in a steam chamber above the producer well 122. Direct contact between the steam chamber and the producer well 122 can result in a drop in system pressure, which increases steam and water production but reduces oil production. It is advantageous to maintain separation between the steam chamber and the producer well 122 for as long as possible.

The open transmission line is well suited to produce wide and flat heated areas. The heated area can be made arbitrarily wide by adjusting the separation between the transmission line conductors 112a and 112b. However, the hydrocarbon formation 102 between the transmission line conductors 112a and 112b may not be heated uniformly until the whole hydrocarbon formation 102 between the transmission line conductors 112a and 112b is desiccated. Regions closer to the transmission line conductors 112a and 112b are heated much more strongly than the regions further from the transmission line conductors 112a and 112b, including the region between the transmission line conductors 112a and 112b.

Underground reservoir simulations indicate that heating a wide, flat and uniform area approximately 2 meters to 8 meters above the producer well 122 can create a steam chamber that is more favorable than when the heated area is narrow, even if the total EM power used for heating is the same. A distance of approximately 8 meters to 40 meters can be considered wide. In contrast, a distance of approximately less than 8 meters can be considered narrow. A more favorable steam chamber is a chamber which stays 'disconnected' (i.e., remains separated) from the producer well 122 for a longer period of time.

It is also preferable to produce as much as economically viable from the underground reservoir. This can be achieved by producing heat laterally far from the open transmission line, while minimizing heating of the under-burden (i.e., region below the underground reservoir) and/or over-burden layers (i.e., region above the underground reservoir). Heating of the under-burden and/or over-burden does not generally result in oil production, and therefore represents radiation losses.

Since the electromagnetic properties of the hydrocarbon formation 102 can vary significantly throughout the heating process, it can be desirable for the EM wave generator 108 to be capable of accommodating a wide impedance range.

Figure 2:
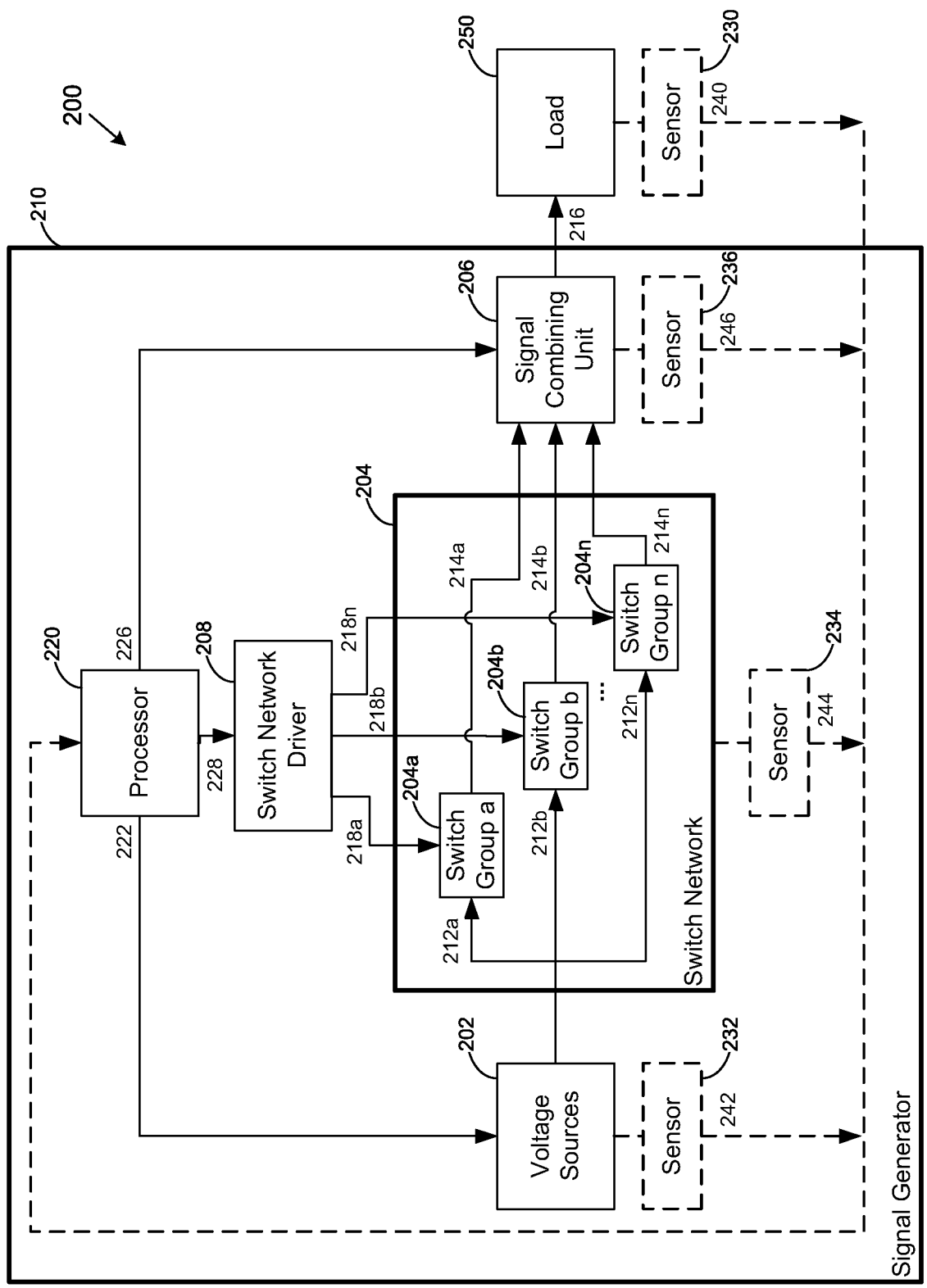
FIG. 2 is a block diagram of a system for electromagnetic heating, in accordance with at least one embodiment.

Referring to FIG. 2, shown therein is a block diagram of a system 200 for electromagnetic heating, in accordance with at least one embodiment. System 200 includes signal generator 210 and load 250. For example, system 200 can be implemented as part of apparatus 100 shown in FIG. 1. That is, signal generator 210 can perform the functions of electromagnetic wave generator 108, and load 250 may act as waveguide portion 110 and transmission line conductors 112.

Signal generator 210 and load 250 can be connected by a coupling member, which facilitates the transfer of one or more output signals 216 from signal generator 210 to load 250. For example, the coupling member can be a waveguide or coaxial cable, such as waveguide portion 110 of FIG. 1. In some cases, the coupling member can be referred to as a connecting cable. The connecting cable can include one or more conductors which act as one or more electrical transmission lines between signal generator 210 and load 250. In some embodiments, the coupling member is considered part of load 250. The coupling member can include a transition region, which has a lower impedance relative to other regions of the coupling member. The lower impedance of the transition region can result in lower voltages in the transition region, minimizing electrical arcing caused by high voltages. In some cases, the transition region can be located at the transition between the coupling member and load 250.

Signal generator 210 generates one or more output signals 216 that can be applied to load 250. Output signals 216 can include more than one frequency and can include a band of frequencies. In some embodiments, the output signals can have a bandwidth between about 1 kilohertz (kHz) to about 100 megahertz (MHz). In some embodiments, the output signals can have a bandwidth that is within the radio frequency (RF) band. An output signal 216 can be characterized by a power spectral density, that is, a measure of the power of the signal as a function of frequency.

Load 250 can be any component that can receive output signals 216 generated by signal generator 210 and produce one or more standing electromagnetic waves along its length. For example, load 250 can be a radiator, antenna, applicator, or lossy transmission line. In some embodiments, load 250 can be an inductive heating coil.

Load 250 has a frequency-dependent impedance. That is, the impedance experienced by a signal applied to load 250 is dependent on the frequency of that signal. The frequency-dependent impedance of load 250 may depend on the material properties, material dispersion, and mechanical configuration of load 250. The mechanical configuration of load 250 includes, for example, the geometry. The frequency-dependent impedance of load 250 may not be constant across its entire geometry. The frequency-dependent impedance of load 250 may also be affected by the environment in which the load 250 is positioned. For example, if load 250 is positioned within a hydrocarbon formation, the impedance of load 250 may be affected by the material composition of the formation. Furthermore, the impedance of load 250 may change over time as its environment changes. For example, the concentration and distribution of water in the hydrocarbon formation may change over time, changing the quasi-static electromagnetic property of the load 250 and the impedance of load 250.

Load 250 can be a variety of geometries and have various physical dimensions. Load 250 has a longitudinal axis, which can be referred to as a length. In some embodiments, load 250 has a length that is sufficient for small changes in the power spectral density of output signals 216 to result in large changes in the pattern of the produced standing electromagnetic waves. In some embodiments, load 250 can be an arrangement of multiple elements, such as a group of radiators.

When output signals 216 are applied to load 250, one or more standing electromagnetic waves are produced along a length of the load 250. The profile or shape of the standing electromagnetic waves can depend on the power spectral densities of the respective output signals 216. Accordingly, signal generator 210 can control the profile of the standing electromagnetic waves by controlling the power spectral density of output signals 216.

The standing electromagnetic waves can include one or more partial standing electromagnetic waves. A partial standing electromagnetic wave may not be a pure standing wave. That is, a partial standing electromagnetic wave can include both standing wave and traveling wave components. In some embodiments, the standing electromagnetic waves can be time-varying. That is, the position of the nodes and the anti-nodes of the standing electromagnetic wave can change over time. Standing electromagnetic waves will be discussed in further detail with respect to FIGS. 3 and 7.

System 200 can be used to electromagnetically heat a hydrocarbon formation. In some embodiments, load 250 can include one or more radiating structures positioned in a hydrocarbon formation. When output signals 216 are applied to the radiating structures, standing electromagnetic waves are produced along a length of the radiating structures and electromagnetic energy is radiated into the hydrocarbon formation.

In some embodiments, the radiating structures may include a first transmission line conductor and a second transmission line conductor. In such embodiments, the signal generator 210 generates a first output signal and a second output signal. The second output signal can be a phase shifted version of the first output signal. That is, the second output signal can include the first output signal with the addition of a phase shift. For example, the second output signal can be the first output signal with a 180° phase shift. The first output signal is applied to the first transmission line conductor and the second output signal is applied to the second transmission line conductor. As a result, the first transmission line conductor and the second transmission line conductor can have electrically different lengths.

As shown in FIG. 2, signal generator 210 includes voltage sources 202, a switch network 204, a switch network driver 208, a signal combining unit 206, a processor 210, and sensors 230, 232, 234, 236.

Processor 220 determines a desired output signal having a desired power spectral density. In some embodiments, the desired output signal is an output signal that, when applied to load 250, produces standing electromagnetic waves with a particular shape or profile. In some cases, the desired output signal is an output signal which results in maximum heating efficiency. Processor 220 controls voltage sources 202, switch network driver 208, and signal combining unit 206, based on a desired output signal, to provide at least one output signal 216.

Processor 220 can be any suitable processors, controllers, digital signal processors, graphics processing units, application specific integrated circuits (ASICs), and/or field programmable gate arrays (FPGAs) that can provide sufficient processing power depending on the configuration, purposes and requirements of the system 200. In some embodiments, the processor 220 can include more than one processor with each processor being configured to perform different dedicated tasks.

Voltage sources 202 generate source signals 212a, 212b, ..., 212n (herein collectively referred to as source signals 212). Source signals 212 can be direct current (DC) signals or alternating current (AC) low frequency signals. Low frequency signals refer to signals that have a frequency at least ten times lower than that of output signals 216.

Voltage sources 202 can be any suitable device for generating source signals 212, such as electrical power source 106. For example, voltage sources 202 may be an energy storage device, a generator, an electrical power grid output, or other power supply. Voltage sources 202 are connected to and transfer source signals 212 to switch network 204. Although voltage sources 202 are shown in FIG. 2 as a single element, it will be appreciated that voltage sources 202 may include more than one element, each of which can generate one or more source signals 212.

The switch network 204 includes switch groups 204a, 204b, ..., 204n (herein collectively referred to as switch groups). One or more switch groups can be connected to voltage sources 202 to receive source signals 212. Although voltage sources 202 is shown as connected to each of switch groups, it will be appreciated that voltage sources 202 may only be connected to only a subset of switch groups, either directly or indirectly. Accordingly, various connections between one or more of voltage sources 202 and one or more of switch groups are possible.

Each switch group can include one or switches. In some cases, a switch group can include two switches, connected in parallel or series. In some cases, a switch group can include three or more switches, connected in parallel, series, or a combination of parallel and series.

Each switch of a switch group can be configured in an open position or a closed position. When a switch is in an open position, signals can pass through the switch. Conversely, when a switch is in a closed position, signals cannot pass through the switch. Switches can be actuated or toggled from an open position to a closed position or a closed position to an open position.

Switch groups may include various types of switches, including electronic and transistor-based switches. For example, switch groups may include a half H-bridge, an H-bridge, a buck converter, a buck-boost converter, a resonant converter, a soft switching converter, a zero voltage switching converter, an arrangement of MOSFETs, BJTs, IBJTs, thyristors, or any other suitable type of switch. In some cases, a switch can be referred to as a transistor switch module. The switches may have a switching frequency within the range of about 1 kilohertz (kHz) to about 100 megahertz (MHz). In some cases, the maximum switching frequency of the switches may be limited by the time constants and/or resonances of switches. The switches may have a high current capacity (i.e., high closed switch current capacity) or a high voltage capacity (i.e., high open switch voltage capacity).

One or more of the switches of a switch group can be actuated to convert source signals 212 into modulated signals 214a, 214b, . . . , 214n (herein collectively referred to as modulated signals 214). That is, the switches can be toggled between open and closed positions to selectively pass or block signals 212. The switches of a switch group can be actuated at different times or frequencies to generate modulated signals 214 with different properties. For example, a first switch may receive a source signal, actuate at a first frequency, and modulate the source signal with a second frequency, which may be the same or different as the first frequency. The modulated signal may then be further modulated by other switches. The modulated signals 214 are capable of providing a desired power spectral density, when combined by signal combining unit 206.

Switch network driver 208 is connected to switch groups and provides modulation signals 218a, 218b, . . . , 218n (herein collectively referred to as modulation signals 218), to the switch groups. The one or more switches of the switch groups are actuated by the modulation signals 218. Modulation signals 218a may actuate the switches at different times and/or frequencies to generate modulated signals 214. For example, one or more switches may be actuated with a first frequency at a first time frame. The one or more switches may be subsequently actuated with a second frequency, different form the first frequency, in a second time frame.

The modulation signals can be different or the same for different switches. In some embodiments, the modulation signal for a first switch may be orthogonal to the modulation signal for a second switch. In such embodiments, the modulated signals generated by the orthogonal modulation signals are orthogonal with to each other.

One or more switch groups are connected to signal combining unit 206. Although each switch group is shown as connected to signal combining unit 206, it will be appreciated that signal combining unit 206 may only be connected to only a subset of switch groups, directly or indirectly. Accordingly, various connections between one or more of voltage sources 202, one or more of switch groups, and signal combining unit 206 are possible. The connections may include various parallel and series connections.

Signal combining unit 206 combines modulated signals 214 into a combined signal. Signal combining unit 206 can combine any number of modulated signals 214 to achieve a particular current level. Signal combining unit 206 then transforms the combined signal to provide one or more output signals 216. Signal combining unit 206 transforms the modulated signals to have the desired power spectral density. Signal combining unit 206 can transform the combined signal to achieve a particular voltage level.

Signal combining unit 206 includes one or more transformers. The transformers can be used to combine modulated signals 214 into a combined signal and transform the combined signal into output signals 216. The transformers can have different configurations, such as the number of windings, phases, etc. In some embodiments, the configuration of the transformers can be adjustable. In such embodiments, the transformers can be reconfigured to adjust various properties of output signals 216, such as power spectral density. Reconfiguration of the transformers can involve circuit relays and other connections.

In some embodiments, signal combining unit 206 may further include inductive and capacitive components. The inductive and capacitive components can be configured adjust a reactance of voltage sources 202, switch network 204, or signal combing unit 206. The inductive and capacitive components can have a variable inductance and capacitance. By adjusting the inductance or capacitance of the inductive and capacitive components, the reactance can be adjusted. The inductive and capacitive components may be variable in discrete steps or continuously variable. For example, an inductor may have a mechanism to vary winding spacing or move a ferrite core. In some embodiments, the inductive and capacitive components may be T networks that include two series inductors and a shunt capacitor. In some embodiments, the inductive and capacitive components can be configured to achieve a reactance to resistance ratio over a bandwidth of interest of less than 1.5. In some embodiments, the inductive and capacitive components can be configured to achieve a reactance to resistance ratio over a bandwidth of interest of less than 1. The bandwidth of interest can be the bandwidth of the output signal 216.

As discussed previously, processor 220 controls the various components of signal generator 210 to generate one or more output signals 216 that achieve the desired output signal having the desired power spectral density. Processor 220 sends control signals 222, 226, 228 to voltage sources 202, switch network driver 208, and signal combining unit 206.

Processor 220 controls voltage sources 202, using control signal 222, to control various properties of one or more of source signals 212. For example, processor 220 can control the voltage level of one or more of source signals 212. In some embodiments, processor 220 may also control the frequency or current level of one or more of source signals 212.

Processor 220 controls switch network driver 208, using control signal 228, to control various properties of modulation signals 218 and thus control the actuation of switches of switch network 204. For example, processor 220 may control the time and frequency of actuation by controlling the modulation signals 218 generated by switch network driver 208. Processor 220 can control what modulation signals are sent to what switches at what times.

Processor 220 controls signal combining unit 206, using control signal 226, to control the combining and transforming of modulated signals 218. For example, processor 220 may select a configuration for one or more transformers of signal combining unit 206. Processor 220 may also operate the inductive and capacitive components of signal combining unit 206.

Sensors 232, 234, 236 can measure one or more properties of voltage sources 202, switch network driver 208, and signal combining unit 206, and send measured data 242, 244, 246 to processor 220. Sensors 232, 234, 236 can measure various properties, including temperature, current, and voltage. In some embodiments, processor 220 can compare the measured properties with one or more predetermined conditions. The predetermined conditions may include an arcing condition, an overheating condition, an overcurrent condition, or an excessive voltage condition. The processor 220 may determine the desired output signal and/or the desired power spectral density based on the comparison.

For example, the processor 220 can receive voltage measurements from sensors 232, 234, 236. The processor 220 can compare the voltage measurements with an overvoltage condition, which may specify a voltage limit for safe operation. The processor 220 can then determine a desired output signal based on the comparison, by determining a desired output signal (and associated power spectral density) that does not result in an overvoltage condition. This may allow signal generator 210 to ensure that its various components are operating within specifications to maximize safety, performance, or longevity. In some cases, this may allow signal generator 210 to minimize or to mitigate the risk of equipment damage caused by high voltage regions and electrical arcing.

In another example, the predetermined condition may be an overheating condition. The processor 220 can compare temperature measurements to determine a desired output signal (and associated power spectral density) to minimize inefficient heating caused by non-uniform heating or hot spots.

Signal generator 210 also includes sensor 230. Sensor 230 measures one or more properties of load 250 and sends measured data 240 to processor 220. Sensor 230 can measure various properties of load 250, including temperature, pressure, production level, material properties, impedance, reactance, resistance, power, and frequency. The processor 220 may determine the desired output signal and/or the desired power spectral density based on the measured properties.

Each sensor 230, 232, 234, 236 shown in FIG. 2 can be one or more sensors. Furthermore, in some embodiments, one or more of sensor 230, 232, 234, 236 may be omitted (as indicated by dashed lines).

In some embodiments, the processor 220 can operate the inductive and capacitive components of the signal combining unit 206 to adjust a reactance measured in load 250 by sensor 230. The reactance measured in load 250 may be a plurality of reactances over a frequency range. That is, the reactance measured in load 250 may not be at a single frequency. In some embodiments, the processor 220 can operate switch network driver 208 to adjust a reactance measured in load 250 by sensor 230.

In some embodiments, signal generator 210 may include a bypass switch (not shown) for bypassing switch network 204 and signal combing unit 206. That is, the bypass switch directly connects voltage sources 202 to load 250. In some cases, it may be desirable to apply source signals directly to load 250. For example, it may be desirable to apply a DC or low frequency AC signal to load 250 when the environment surrounding load 250 is highly conductive. Furthermore, it will be appreciated that when the signal generator 210 performs the functions of the EM wave generator 108 and applies a DC or low frequency AC signal to the load 250, that is the waveguide portion 110 and the transmission line conductors, the waveguide portion 110 carries the DC or low frequency AC signal from the EM wave generator 108 to the transmission line conductors 112a and 112b. That is, although the term "waveguide" is typically used to refer to a device that transmits AC signals, as used herein, the term "waveguide" also refers to a device that transmits DC or low frequency AC signals. For example, the waveguide portion 110 can be a transmission line, or more specifically, a coaxial transmission line.

Figure 3:
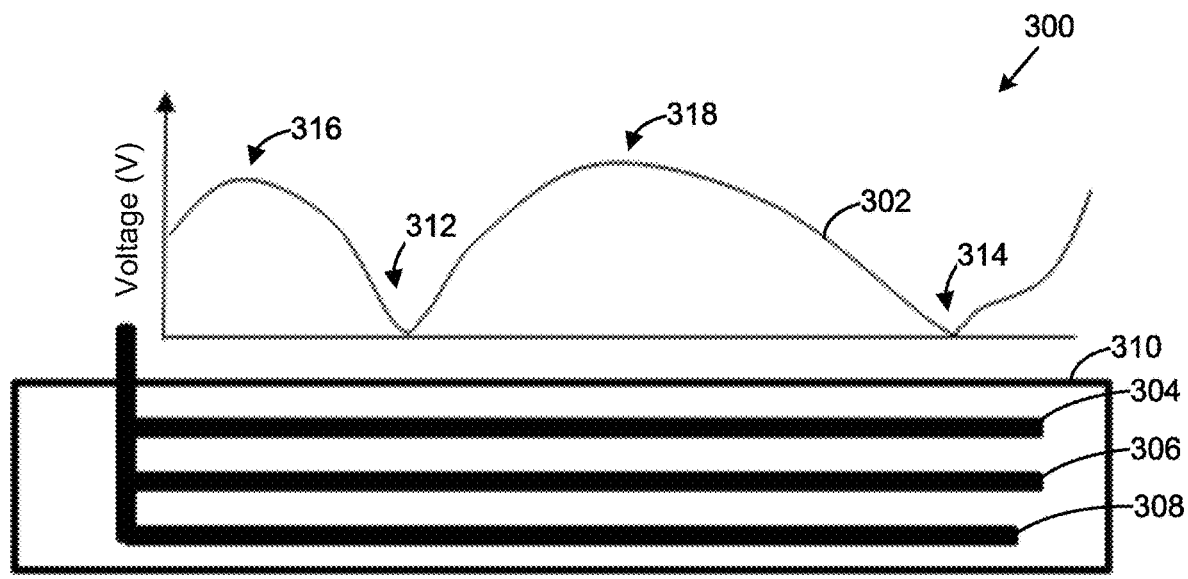
FIG. 3 is an illustration of a profile view of an apparatus for electromagnetic heating of a hydrocarbon formation and a standing electromagnetic wave, in accordance with at least one embodiment.

Referring to FIG. 3, shown therein is an illustration 300 of a profile view of radiating structures 304, 306, 308 and a standing electromagnetic wave 302, in accordance with at least one embodiment. Radiating structures 304, 306, 308 are positioned in hydrocarbon formation 310. It will be appreciated that although radiating structures 304, 306, 308 are shown in as linear structures in a parallel arrangement, various other geometries and arrangements are possible.

Standing electromagnetic wave 302 is produced along the length of radiating structures 304, 306, 308 when particular signals (such as output signals 216 generated by signal generator 210) are applied to radiating structures 304, 306, 308. The voltage of standing electromagnetic wave 302 varies along the length of radiating structures 304, 306, 308.

Standing electromagnetic wave 302 may correspond to a desired spatial heating profile to be achieved along a length of the radiating structures. For example, low voltage regions 312, 314 of standing electromagnetic wave 302 may correspond to regions where lower heat is desired. Similarly, high voltage regions 316, 318 of standing electromagnetic wave 302 may correspond to regions where higher heat is desired.

As discussed above, signal generator 210 can control the shape or profile of standing electromagnetic wave 302 by controlling the power spectral density of output signals 216. Accordingly, signal generator 210 can also control the spatial heating profile by controlling output signals 216.

Adjusting the desired spatial heating profile may increase efficiency by minimizing heating in areas of the formation which have already been produced, or in poor pay zones that are not economic to produce. In some embodiments, the spatial heating profile may be configured to focus power to regions where hydrocarbon has not yet been sufficiently extracted and minimize heating in areas that are depleted or where the formation has initially poor hydrocarbon saturation.

Figure 4:
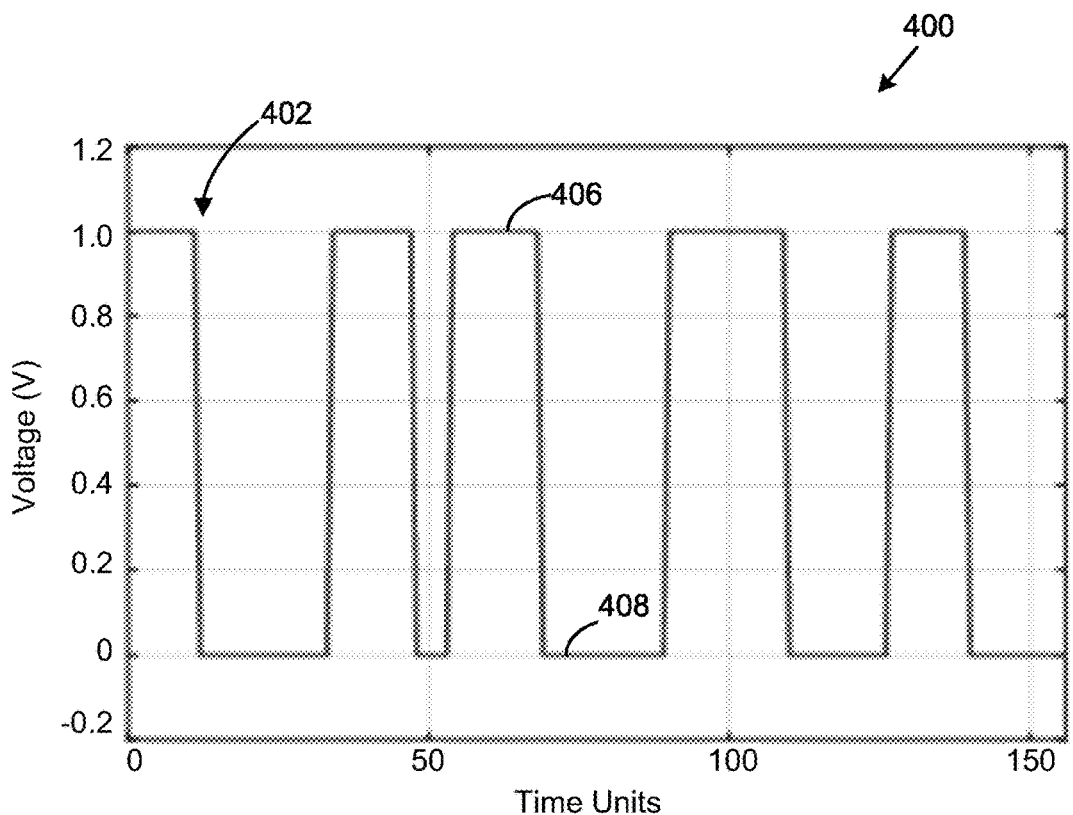
FIG. 4 is an illustration of a modulation signal, in accordance with at least one embodiment.

Referring to FIG. 4, shown therein is an illustration 400 of a modulation signal 402, in accordance with at least one embodiment. Modulation signal 402 is an example of a modulation signal that can be generated by a switch network driver to actuate one or more switches (such as modulation signal 218 generated by switch network driver 208 and switches of the switch network 204). In this embodiment, modulation signal 402 is a binary waveform. However, it will be appreciated that a modulation signal may be any suitable waveform.

Modulation signal 402 is an aperiodic waveform. However, in some embodiments, modulation signals may be periodic. In some embodiments, only particular time frames of the modulation signal are periodic.

Modulation signal 402 can include a dwell time for a switch being actuated by the signal. The dwell time corresponds to a time where the switch is either in an open position or a closed position. For example, a dwell time of modulation signal 402 may refer to a time where modulation signal 402 is equal to 1, such as segment 406, or a time where the modulation signal 402 is equal to 0, such as segment 408. Accordingly, the actuation of a switch may be delayed until a dwell time from that switch has elapsed.

In some embodiments, modulation signal 402 represents a chaotic binary signal or a spread spectrum coded signal. That is, the modulation signal 402 can be a noise-like signal. In some embodiments, the modulation signal 402 can be a pseudo random signal. In some embodiments, the modulation signal 402 can have statistical and/or chaotic properties tailored to a desired power spectral density of the output signal 216 of the signal generator 210.

Figure 5:
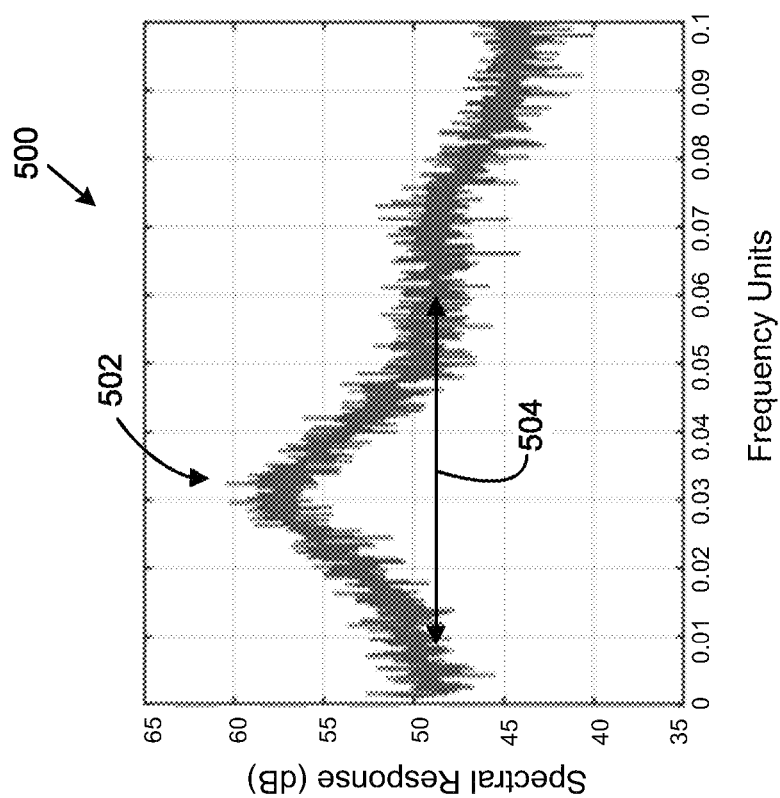
FIG. 5 is an illustration of a power spectral density, in accordance with at least one embodiment.

Referring to FIG. 5, shown therein is an illustration 500 of a power spectral density 502, in accordance with at least one embodiment. Power spectral density 502 corresponds to an output signal generated by a signal generator (such as output signals 216 and signal generator 210). Power spectral density 502 was generated using modulation signals with dwell times randomly selected between 4 and 24 time increment units. The center frequency of power spectral density 502 may be adjusted by adjusting the average period of the modulation signals. Power spectral density 502 can have a relatively broad bandwidth as illustrated by the spectral width of 504

Figure 6:
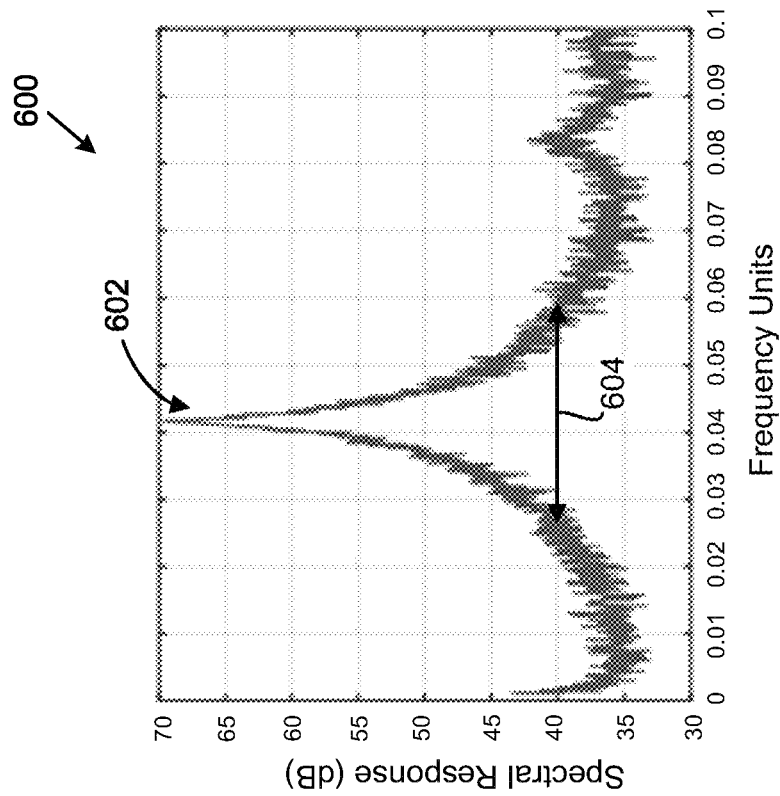
FIG. 6 is an illustration of a power spectral density, in accordance with at least one embodiment.

Referring to FIG. 6, shown therein is an illustration 600 of a power spectral density 602, in accordance with at least one embodiment. Power spectral density 602 corresponds to an output signal generated by a signal generator (such as output signals 216 and signal generator 210). Power spectral density 602 was generated using modulation signals with dwell times randomly selected between 10 and 14 time increment units. Power spectral density 602 has a width 604 of approximately 0.03 frequency units. Accordingly, power spectral density 602 is narrower than power spectral density 502. The shape of the power spectral density can be adjusted by adjusting the dwell time of the modulation signals.

Figure 7:
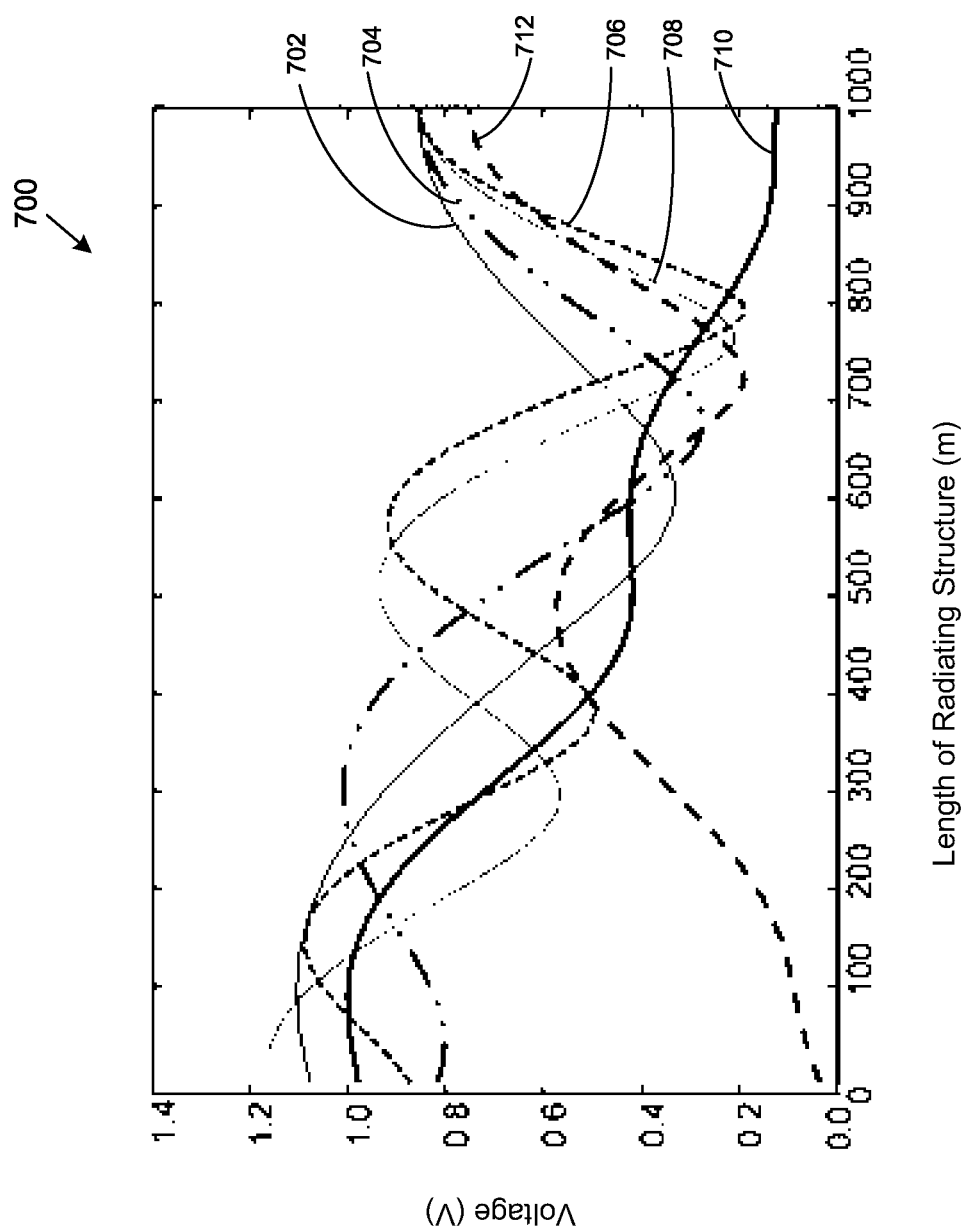
FIG. 7 is an illustration of standing electromagnetic waves, in accordance with at least one embodiment.

Referring to FIG. 7, shown therein is an illustration 700 of standing electromagnetic waves 710 and 712, in accordance with at least one embodiment. Standing electromagnetic waves 710 and 712 are produced when particular electrical signals are applied to a load (such as output signals 216 produced by signal generator 210 and load 250). Different output signals were used to produce standing electromagnetic waves 710 and 712, resulting in different standing wave patterns.

Illustration 700 further includes standing electromagnetic waves 702, 704, 706, 708. Standing electromagnetic waves 702, 704, 706, 708 are produced when modulated signals are directly applied to a load (such as modulated signals 214 and load 250).

Standing electromagnetic waves 710 and 712 can be described as a superposition of standing electromagnetic waves 702, 704, 706, 708. That is, the output signals used to produce standing electromagnetic waves 710 and 712 were generated by combining the modulated signals used to produce standing electromagnetic waves 702, 704, 706, 708.

Different weights can be used to combine the modulated signals into output signals. That is, modulated signals may not be combined equally, and two output signals formed using the same modulation signals may be different. For example, although the output signals for standing electromagnetic waves 710 and 712 were both produced by combining the modulated signals for standing electromagnetic waves 702, 704, 706, 708, standing electromagnetic wave 710 has a different profile than standing electromagnetic wave 712.

The amplitude of standing electromagnetic wave 710 and 712 decreases with increasing distance due to formation losses. However, if formations losses are low, this effect may be minimal, such as in the standing wave 302 of FIG. 3.

Figure 8:
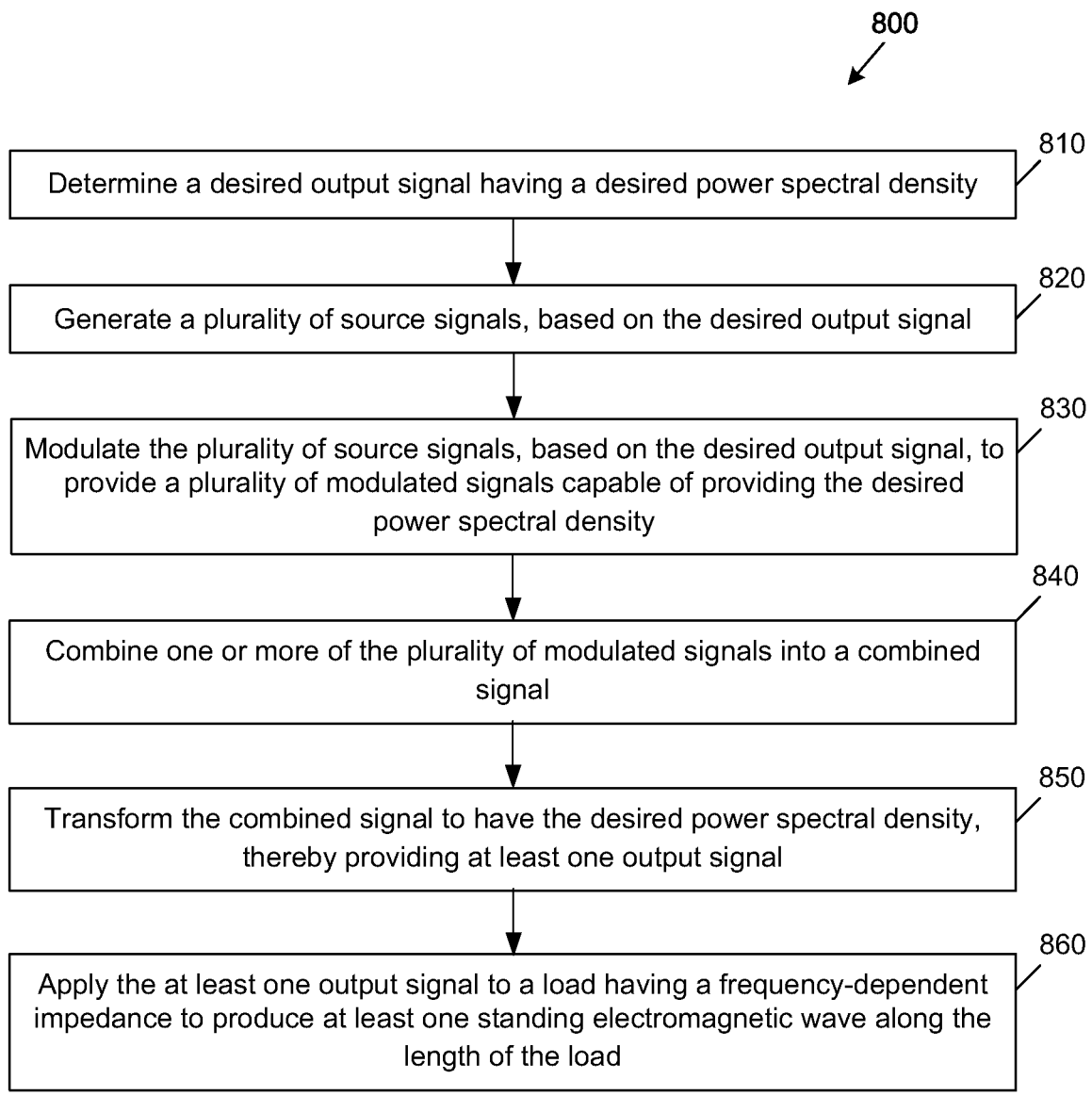
FIG. 8 is a flowchart of a method for generating an output signal, in accordance with at least one embodiment.

Referring to FIG. 8, shown therein is an example method 800 for generating an output signal, in accordance with at least one embodiment. In some embodiments, method 800 may be implemented using signal generator 210 and load 250 of system 200. Method 800 begins with determining a desired output signal having a desired power spectral density at 810. For example, processor 220 of signal generator 210 may determine a desired output signal having a desired power spectral density.

In some embodiments, at 810, one or more properties of at least one of a plurality of voltage sources used for generating a plurality of source signals, a plurality of switch groups used for modulating the plurality of source signals to provide a plurality of modulated signals, and a signal combining unit used for combining one or more of the plurality of modulated signals into a combined signal and providing the at least one output signal are measured. The one or more properties can include at least one of temperature, current, and voltage. For example, sensors 232, 234, 236 can measure one or more properties of voltage sources 202, switch network 204, and signal combining unit 206. The desired output signal having the desired power spectral density is determined based on a comparison of the one or more properties measured from the at least one of the plurality of voltage sources, the plurality of switch groups, and the signal combining unit with at least one of an arcing condition, an overheating condition, an overcurrent condition, and an excessive voltage condition. For example, processor 220 can compare the one or more properties measured by sensors 232, 234, 236 with various conditions.

In some embodiments, at 810, one or more properties of the load are measured. The one or more properties include at least one of temperature, pressure, production level, material properties, material dispersion, impedance, reactance, resistance, power, and frequency. For example, sensor 230 can measure one or more properties of load 250. The desired output signal having the desired power spectral density is determined based on the one or more properties measured from the load. For example, processor 220 can make the determination based on the one or more properties measured by sensor 230.

At 820, a plurality of source signals is generated, based on the desired output signal. For example, voltage sources 202 of signal generator 210 may generate source signals 212 based on the desired output signal.

In some embodiments, at 820, a voltage level of at least one of the plurality of source signals is controlled. For example, processor 210 may control the voltage level of source signals 212.

At 830, the plurality of source signals is modulated, based on the desired output signal, to provide a plurality of modulated signals capable of providing the desired power spectral density. For example, one or more of switches of signal generator 210 may be actuated to modulate source signals 212 to provide modulated signals 214.

In some embodiments, at 830, one or more switches are actuated. The one or more switches can be actuated by one or more modulation signals. In some embodiments, at 830, one or more switches are actuated at different times to generate the modulated signals. For example, switch groups can be actuated by modulation signals 218.

In some embodiments, at 830, the actuation of the one or more switch is delayed until a dwell time for the one or more switch has elapsed. For example, a modulation signal such as modulation signal 402 can be used for actuating the one or more switches at 830. The dwell time for one or more switches can be, for example, segment 406 when the modulation signal 402 is equal to 1, or segment 408 when the modulation signal is equal to 0. In some embodiments, at 830, the one or more switches are actuated with a first frequency in a first time frame and the one or more switches are subsequently actuated with a second frequency in a second time frame, the second frequency being different from the first frequency.

At 840, one or more of the plurality of modulated signals are combined into a combined signal. For example, signal combining unit 206 of signal generator 210 may combine modulated signals 214 into a combined signal.

At 850, the combined signal is transformed to have the desired power spectral density, thereby providing at least one output signal. For example, signal combining unit 206 of signal generator 210 may transform combined signal to have the desired power spectral density to provide one or more output signals 216.

In some embodiments, at 850, a configuration of at least one transformer is selected to achieve the desired power spectral density. For example, processor 220 may select a configuration of a transformer of signal combing unit 206, such as the number of windings or phases.

In some embodiments, at 850, at least one of a plurality of inductive and capacitive components are operated to adjust for a reactance in at least one of the plurality of voltage sources, the plurality of switch groups, and the signal combining unit. For example, processor 220 may operate inductive and capacitive components within signal combining unit 206 to achieve overall optimal operation of the signal generator 210.

At 860, the at least one output signal is applied to a load having a frequency-dependent impedance to produce at least one standing electromagnetic wave along a length of the load. The at least one standing electromagnetic wave includes at least a partial standing electromagnetic wave. For example, output signals 216 generated from signal generator 210 may be applied to load 250 to produce one or more standing electromagnetic waves along the length of load 250.

In some embodiments, the at least one output signal includes a first output signal and a second output signal. The second output signal includes the first output signal having a phase shift. The at least one radiating structure includes a first transmission line conductor and a second transmission line conductor. At 860, the first output signal can be applied to the first transmission line conductor and the second output signal can be applied to the second transmission line conductor. For example, output signals 216 generated by signal generator 210 can be applied to transmission line conductors 112*a* and 112*b*.

Numerous specific details are set forth herein in order to provide a thorough understanding of the exemplary embodiments described herein. However, it will be understood by those of ordinary skill in the art that these embodiments may be practiced without these specific details. In other instances, well-known methods, procedures and components have not been described in detail so as not to obscure the description of the embodiments. Furthermore, this description is not to be considered as limiting the scope of these embodiments in any way, but rather as merely describing the implementation of these various embodiments.

The invention claimed is:

1. A signal generator comprising:
a plurality of voltage sources for generating a plurality of source signals;
a plurality of switch groups for converting the plurality of source signals into a plurality of modulated signals by actuating one or more switches of the plurality of switch groups, the plurality of modulated signals being capable of providing a desired power spectral density;
at least one switch network driver for providing a plurality of modulation signals to the plurality of switch groups, the one or more switches of the switch groups being actuated by the plurality of modulation signals;
a signal combining unit comprising at least one transformer, the signal combining unit for combining one or more of the plurality of modulated signals into a combined signal and transforming the combined signal to have the desired power spectral density, thereby providing at least one output signal; and
a processor configured to:
determine a desired output signal of the at least one output signal having the desired power spectral density; and
control the plurality of voltage sources, the at least one switch network driver, and the signal combining unit based on the desired output signal;
wherein when the at least one output signal is applied to a load having a frequency-dependent impedance, at least one standing electromagnetic wave is produced along a length of the load, the at least one standing electromagnetic wave comprises at least a partial standing electromagnetic wave.

2. The signal generator of claim 1, wherein the frequency-dependent impedance varies with respect to at least one of a mechanical configuration of the load and a temporal quasi-static electromagnetic property of the load.

3. The signal generator of claim 1, wherein the load comprises at least one radiating structure positioned in a hydrocarbon formation, when the at least one output signal is applied to a load, electromagnetic energy is radiated into the hydrocarbon formation, and the at least one standing electromagnetic wave is produced along a length of the at least one radiating structure, the at least one standing electromagnetic wave corresponds to a desired spatial heating profile to be achieved along the length of the at least one radiating structure.

4. The signal generator of claim 3, wherein:
the at least one radiating structure comprises a first transmission line conductor and a second transmission line conductor; and
the at least one output signal comprises a first output signal for being applied to the first transmission line conductor and a second output signal for being applied to the second transmission line conductor, the second output signal comprising the first output signal having a phase shift.

5. The signal generator of claim 1, wherein the one or more switches of the switch groups are actuated by the plurality of modulation signals at different times to generate the modulated signals.

6. The signal generator of claim 1, wherein the one of more switches of the plurality of switch groups comprise at least two switches.

7. The signal generator of claim 1, wherein each of the plurality of switch groups can be connected to an input of the signal combining unit to provide the plurality of modulated signals to the signal combining unit.

8. The signal generator of claim 1, wherein the plurality of switch groups comprise at least one of a half H-bridge, an H-bridge, a buck converter, a buck-boost converter, a resonant converter, a soft switching converter, and a zero voltage switching converter.

9. The signal generator of claim 1, wherein the processor being configured to control the plurality of voltage sources comprises the processor being configured to control a voltage level of at least one of the plurality of source signals.

10. The signal generator of claim 1, wherein the processor being configured to control the signal combining unit comprises the processor being configured to select a configuration of the at least one transformer to achieve the desired power spectral density.

11. The signal generator of claim 1, wherein:
the signal generator further comprises at least one signal generator sensing device for measuring one or more properties of at least one of the plurality of voltage sources, the plurality of switch groups, and the signal combining unit, the one or more properties comprising at least one of temperature, current, and voltage;
wherein the processor being configured to determine the desired output signal having the desired power spectral density is further based on a comparison of the one or more properties measured from the at least one of the plurality of voltage sources, the plurality of switch groups, and the signal combining unit, with at least one of an arcing condition, an overheating condition, an overcurrent condition, and an excessive voltage condition.

12. The signal generator of any one of claim 1, wherein:
the signal generator further comprises at least one load sensing device for measuring one or more properties of the load, the one or more properties comprising at least one of temperature, pressure, production level, material properties, impedance, reactance, resistance, power, and frequency; and
wherein the processor being configured to determine the desired output signal having the desired power spectral density is further based on the one or more properties measured from the load.

13. The signal generator of claim 1, wherein:
the signal combining unit further comprises a plurality of inductive and capacitive components; and
the processor being configured to control the signal combining unit further comprises the processor being configured to operate the plurality of inductive and capacitive components based on adjusting for a reactance measured in the load.

14. A method for generating at least one output signal, the method comprising:
determining a desired output signal of the at least one output signal having a desired power spectral density;
generating a plurality of source signals, based on the desired output signal;
modulating the plurality of source signals, based on the desired output signal, to provide a plurality of modulated signals capable of providing the desired power spectral density;
combining one or more of the plurality of modulated signals into a combined signal;
transforming the combined signal to have the desired power spectral density, thereby providing the at least one output signal; and
applying the at least one output signal to a load having a frequency-dependent impedance to produce at least one standing electromagnetic wave along a length of the load, the at least one standing electromagnetic wave comprising at least a partial standing electromagnetic wave.

15. The method of claim 14, wherein the frequency-dependent impedance varies with respect to at least one of a mechanical configuration of the load and a temporal quasi-static electromagnetic property of the load.

16. The method of claim 14, wherein the load comprises at least one radiating structure positioned in a hydrocarbon formation, applying the at least one output signal to the load radiates electromagnetic energy into the hydrocarbon formation, and the at least one standing electromagnetic wave is produced along a length of the at least one radiating structure, the at least one standing electromagnetic wave corresponds to a desired spatial heating profile to be achieved along the length of the at least one radiating structure.

17. The method of claim 16, wherein:
the at least one output signal comprises a first output signal and a second output signal, the second output signal comprising the first output signal having a phase shift;
the at least one radiating structure comprises a first transmission line conductor and a second transmission line conductor; and
applying the at least one output signal to at least one radiating structure comprises applying the first output signal to the first transmission line conductor and applying the second output signal to the second transmission line conductor.

18. The method of claim 14, wherein the modulating the plurality of source signals comprises actuating the one or more switches with a first frequency in a first time frame and subsequently actuating the one or more switches with a second frequency in a second time frame, the second frequency being different from the first frequency.

19. The method of claim 14, wherein modulating the plurality of source signals comprises actuating one or more switches at different times to generate the modulated signals.

20. The method of claim 14, wherein generating a plurality of source signals further comprises controlling a voltage level of at least one of the plurality of source signals.

21. The method of claim 14, wherein transforming the combined signal to have the desired power spectral density further comprises selecting a configuration of at least one transformer to achieve the desired power spectral density.

* * * * *